US012805020B2

(12) United States Patent
Kitani

(10) Patent No.: US 12,805,020 B2
(45) Date of Patent: Nov. 17, 2026

(54) SEMICONDUCTOR DEVICE FOR SHORT CIRCUIT DETECTION

(71) Applicant: MICRON TECHNOLOGY, INC., Boise, ID (US)

(72) Inventor: Tomohiro Kitani, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 357 days.

(21) Appl. No.: 18/618,645

(22) Filed: Mar. 27, 2024

(65) Prior Publication Data

US 2024/0339445 A1 Oct. 10, 2024

Related U.S. Application Data

(60) Provisional application No. 63/495,075, filed on Apr. 7, 2023.

(51) Int. Cl.
*H10D 89/10* (2025.01)
*H10B 12/00* (2023.01)
*H10D 89/60* (2025.01)

(52) U.S. Cl.
CPC ............. *H10D 89/10* (2025.01); *H10B 12/50* (2023.02); *H10D 89/60* (2025.01); *H10B 12/482* (2023.02)

(58) Field of Classification Search
CPC .. H10B 12/00; H10B 12/0335; H10B 12/053; H10B 12/09; H10B 12/315; H10B 12/34; H10B 12/482; H10B 12/485; H10B 12/50; H10D 89/10; H10D 89/60; H10W 20/033; H10W 20/0698; H10W 20/083; H10W 20/20
See application file for complete search history.

(56) References Cited

U.S. PATENT DOCUMENTS

2022/0139927 A1* 5/2022 Chang .................. H10B 12/315 257/296
2023/0038881 A1* 2/2023 Kim ........................ H10B 12/34
2023/0102043 A1* 3/2023 Yoon .................... H10B 12/488 257/296

* cited by examiner

*Primary Examiner* — Brook Kebede
(74) *Attorney, Agent, or Firm* — Dorsey & Whitney LLP

(57) ABSTRACT

An apparatus includes: a semiconductor substrate: active regions in the semiconductor substrate, each of the active regions surrounded by a shallow trench isolation and each divided, at least in part, into a first active area and a second active area having a channel area therebetween; first wirings over the plurality of active regions, each of the first wirings coupled to the first active areas of corresponding ones of the active regions; and second wirings over the active regions, each of the second wirings coupled to the second active areas of associated ones of the active regions. Each of the active regions has a longer side in a first direction, each of the first wirings extends in a second direction different from the first direction and each of the second wirings extends in a third direction different from each of the first direction and the second direction.

14 Claims, 3 Drawing Sheets

SEMICONDUCTOR DEVICE FOR SHORT CIRCUIT DETECTION

CROSS-REFERENCE TO RELATED APPLICATIONS

This application claims the filing benefit of U.S. Provisional Application No. 63/495,075, filed Apr. 7, 2024. This application is incorporated by reference herein in its entirety and for all purposes.

BACKGROUND

In recent years, there has been a demand for increased memory capacity of semiconductor devices which are exemplified by dynamic random access memories (DRAMs), and it is a practice to increase the memory capacity by using finer processing dimensions. However, the distance between conductive components is reduced, which may cause a short circuit or current leakage between the conductive components. In order to detect a short circuit or current leakage between conductive components, Test Element Group (TEG) including a semiconductor device for short circuit detection may be used.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

A semiconductor device for short circuit detection according to an embodiment will be described below with reference to the drawings. The following description will be made by exemplifying a short circuit detection in a memory cell of a dynamic random access memory (hereinafter referred to as DRAM). In the description of embodiments, common or related elements or substantially the same elements are denoted by the same reference signs, and description thereof is omitted. In the following figures, the dimensions and dimensional ratios of respective components in respective figures do not necessarily match the dimensions and dimensional ratios in the embodiments. Further, in the following description, a Y-direction is perpendicular to an X-direction. A Z-direction is perpendicular to an X-Y plane which is a plane of a semiconductor substrate, and it is sometimes referred to as a vertical direction.

Figure 1:
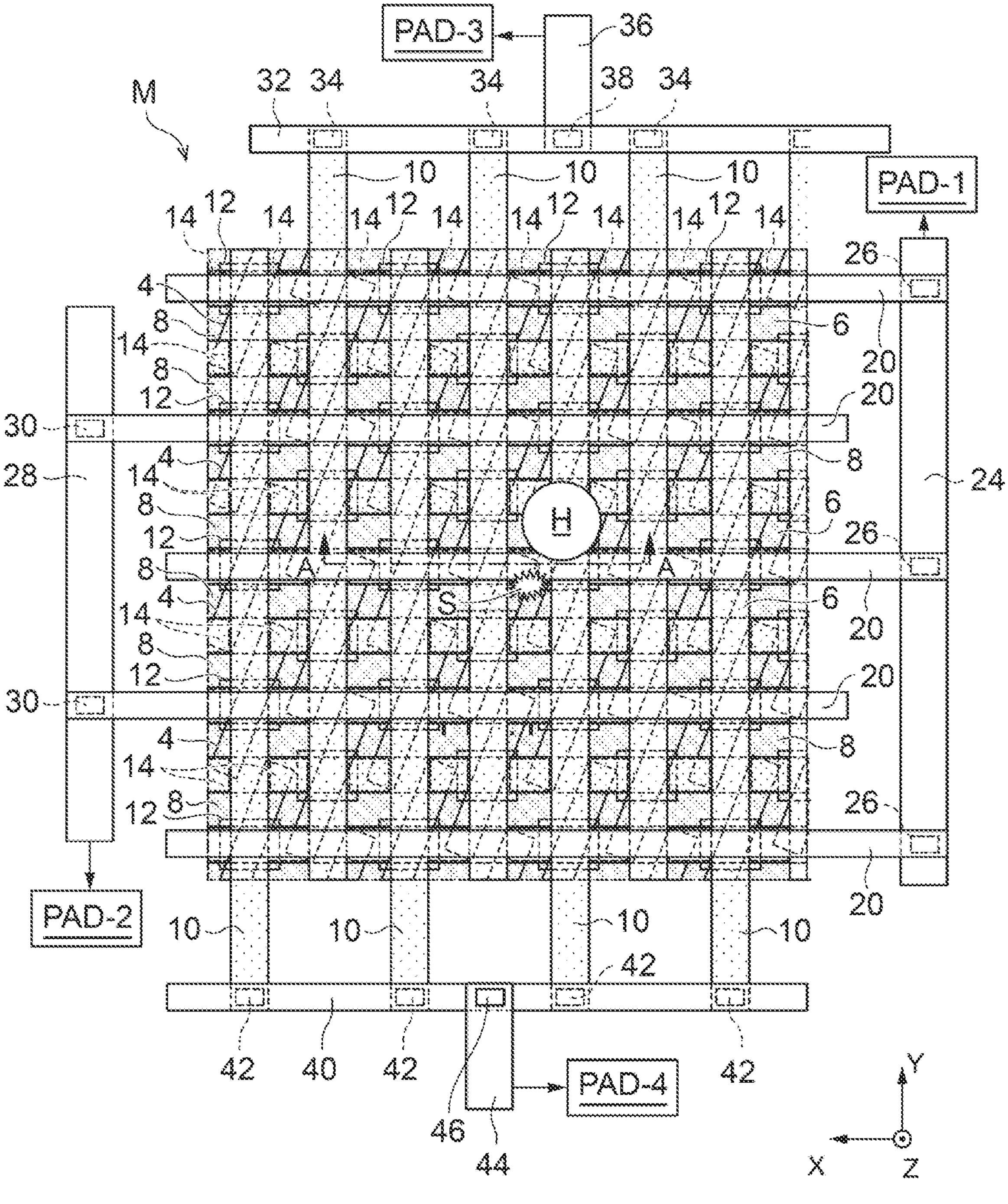
FIG. 1 is a plan view showing a schematic configuration of a semiconductor device for short circuit detection according to a first embodiment.

A semiconductor device for short circuit detection according to a first embodiment will be described below. FIG. 1 shows a semiconductor device for short circuit detection for detecting a short circuit or current leakage in a memory cell area of DRAM. The semiconductor device for short circuit detection is formed on a semiconductor substrate as described later.

As shown in FIG. 1, the semiconductor device for short circuit detection includes a memory cell pattern M, cell contact leading lines 20 led out from the memory cell pattern M, a first pad connection line 24, a second pad connection line 28, a first pad PAD-1 and a second pad PAD-2. In addition, the semiconductor device for short circuit detection includes bit-lines 10 led out from the memory cell pattern M, a first bit-line connection lines 32, a second bit-line connection line 40, a third pad connection line 36, a fourth pad connection line 44, a third pad PAD-3 and a fourth pad PAD-4.

The first pad connection line 24, the second pad connection line 28, the first pad PAD-1, the second pad PAD-2, the first bit-line connection line 32, the second bit-line connection line 40, the third pad connection line 36, the fourth pad connection line 44, the third pad PAD-3, and the fourth pad PAD-4 include, for example, conductors of tungsten, aluminum, copper or the like. The first pad PAD-1 and the second pad PAD-2 are electrically independent of each other. The third pad PAD-3 and the fourth pad PAD-4 are electrically independent of each other.

The first pad connection line 24 and the second pad connection line 28 serve as global wirings which are commonly coupled to a plurality of cell contact leading lines 20. In FIG. 1, the first pad connection line 24 is arranged on the right side of the memory cell pattern M for measurement, and the second pad connection line 28 is arranged on the left side of the memory cell pattern M for measurement. The first bit-line connection line 32 and the second bit-line connection line 40 serve as global wirings which are commonly coupled to a plurality of bit-lines 10. In FIG. 1, the first bit-line connection line 32 is arranged on the far side of the memory cell pattern M for measurement, and the second bit-line connection line 40 is arranged on the near side of the memory cell pattern M for measurement.

Each of a plurality of word-lines 8 extends in the X-direction. The plurality of word-lines 8 are arranged in parallel to one another at substantially equal intervals. Each of the plurality of bit-lines 10 extends in the Y-direction. The plurality of bit-lines 10 are arranged in parallel to one another at substantially equal intervals. The word-lines 8 and the bit-lines 10 are orthogonal to each other.

The plurality of bit-lines 10 are alternately led out to the upper and lower sides in the Y-direction in FIG. 1. Even-numbered bit-lines 10 are led out to the upper side in the Y-direction in FIG. 1. The led-out bit-lines 10 are connected to the first bit-line connection line 32 via contacts 34. The first bit-line connection line 32 is connected to the third pad connection line 36 via a contact 38. The third pad connection line 36 is connected to the third pad PAD-3.

Odd-numbered bit-lines 10 are led out to the lower side in the Y-direction in FIG. 1. The led-out bit-lines 10 are connected to the second bit line connection line 40 via contacts 42. The second bit-line connection line 40 is connected to the fourth pad connection line 44 via a contact 46. The fourth pad connection line 44 is connected to the fourth pad PAD-4.

The memory cell pattern M includes a plurality of active regions 4. Each of the active regions 4 has an elongated island-like shape, and the long side thereof extends diagonally from the upper right to the lower left in FIG. 1. The plurality of active regions 4 are arranged in a so-called half-pitch layout. Regions other than the active regions 4 serve as isolations 6, and the isolation 6 is surrounded by the active regions 4.

The active region 4 is divided into a central active area located in the center of the active region 4, an edge active area located at an edge thereof, and a channel area located between the central active area and the edge active area. The channel area is located below the word-line 8. Each of the word-lines 8 partially extends above the corresponding channel area of the active region 4. A bit contact 12 is arranged in the central active area of the active region 4, and the active region 4 and the bit-line 10 are connected to each other via a bit contact 12. The word-lines 8 are arranged so as to sandwich the bit contacts 12 therebetween in the Y-direction.

The memory cell pattern M includes a plurality of cell contacts 14. Each cell contact 14 is connected to the edge active area of the active region 4. The cell contacts 14 are arranged so as to sandwich bit contacts 12 adjacent thereto, respectively. The cell contacts 14 connected to the adjacent active regions 4 are arranged side by side in a row in the X-direction. As described later, the cell contact leading line 20 is connected to upper portions of the cell contacts 14, and no capacitive element of the DRAM memory is provided.

The cell contact leading lines 20 are connected to the memory cell pattern M. The cell contact leading lines 20 are arranged with two word-lines 8 interposed therebetween. The cell contact leading lines 20 extend in the X-direction. Each of the cell contact leading lines 20 is arranged between the word-lines 8 adjacent thereto. The cell contact leading lines 20 are connected to the plurality of cell contacts 14 which are arranged side by side in a row in the X-direction. The respective cell contact leading lines 20 are alternately led out to the left side and right side in the X-direction in FIG. 1.

On the right side in the X-direction in FIG. 1, odd-numbered cell contact leading lines 20 are led out. The led-out cell contact leading lines 20 are connected to the first pad connection line 24 via contacts 26. The first pad connection line 24 is connected to the first pad PAD-1. On the left side in the X-direction in FIG. 1, even-numbered cell contact leading lines 20 are led out. The led-out cell contact leading lines 20 are connected to the second pad connection line 28 via contacts 30. The second pad connection line 28 is connected to the second pad PAD-2. The distance between adjacent word-lines 8 is substantially half the distance between adjacent cell contact leading lines 20. The distance between adjacent bit-lines 10 is substantially half the distance between adjacent cell contact leading lines 20.

Figure 2:
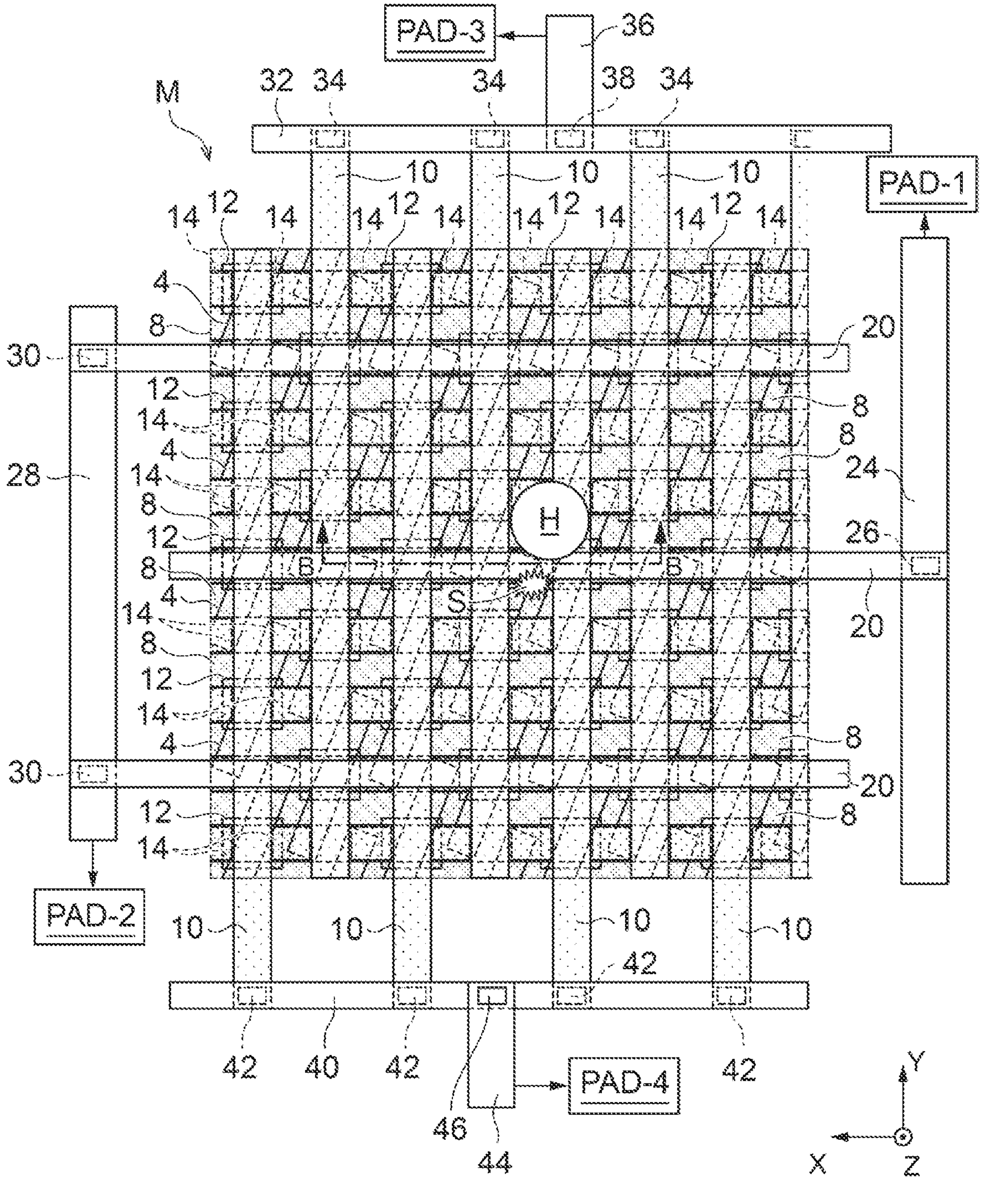
FIG. 2 is a plan view showing a schematic configuration of a semiconductor device for short circuit detection according to a second embodiment.

Next, a semiconductor device for short circuit detection according to a second embodiment will be described. As shown in FIG. 2, in the semiconductor device for short circuit detection according to the second embodiment, cell contact leading lines 20 are arranged with three word-lines 8 interposed therebetween. The cell contact leading lines 20 extend in the X-direction. The cell contact leading lines 20 is connected to a plurality of cell contacts 14 which are arranged side by side in a row in the X-direction. The respective cell contact leading lines 20 are alternately led out to the left side and right side in the X-direction in FIG. 3. The other configurations are the same as those of the semiconductor device for short circuit detection according to the first embodiment. In the semiconductor device for short circuit detection according to the second embodiment, the distance between adjacent cell contact leading lines 20 is set to be larger. This makes it easier to form the cell contact leading lines 20. The distance between adjacent word-lines 8 is substantially one third of the distance between adjacent cell contact leading lines 20. The distance between adjacent bit-lines 10 is substantially one third of the distance between adjacent cell contact leading lines 20.

Figure 3:
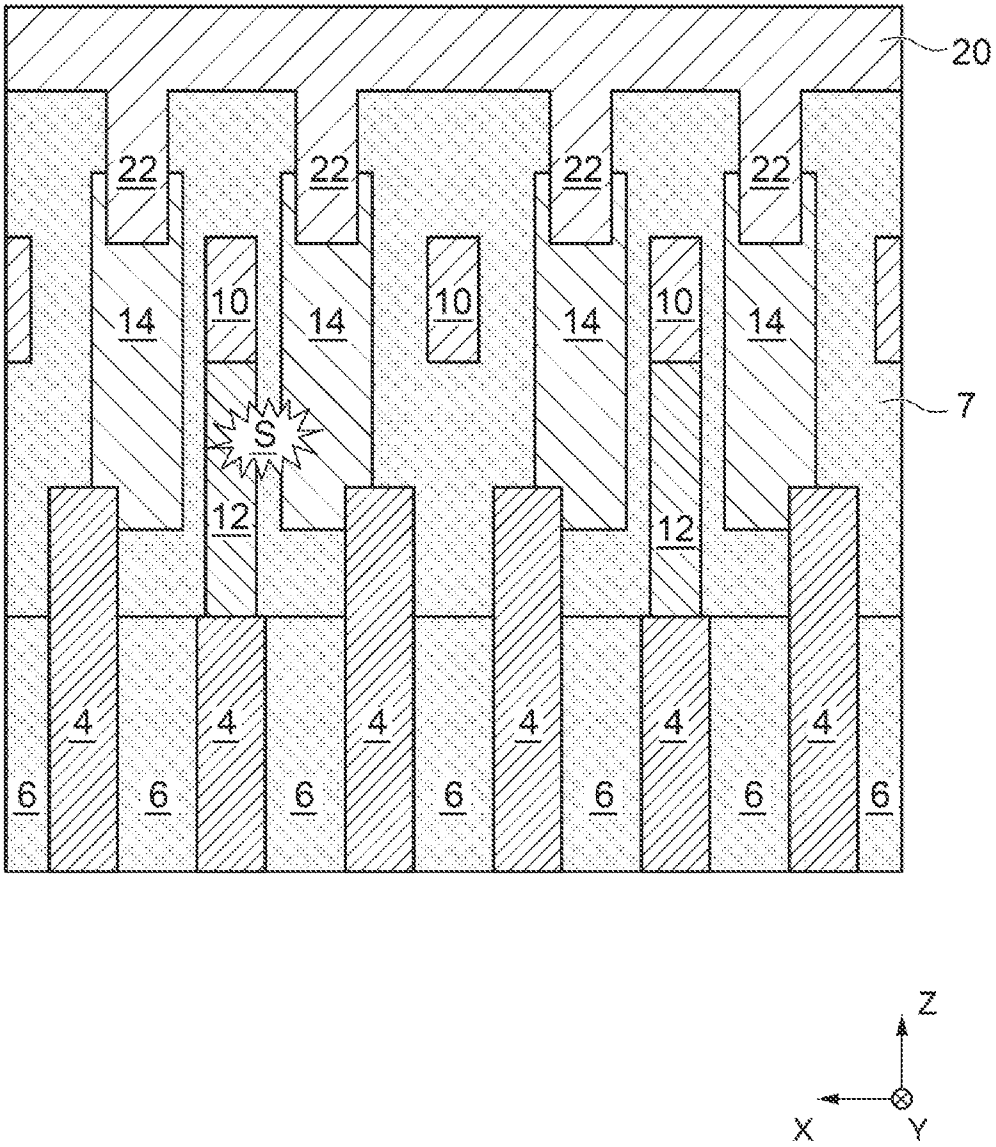
FIG. 3 is a diagram showing the schematic configuration of the semiconductor devices for short circuit detection according to the first and second embodiments, and is a longitudinally-sectional view showing the schematic configurations along line A-A in FIG. 1 and line B-B in FIG. 2.

Next, cross-sectional structures of the semiconductor devices for short circuit detection according to the first and second embodiments will be described. FIG. 3 is a longitudinally sectional view showing a schematic configuration along line A-A of FIG. 1, and also a longitudinally sectional view showing a schematic configuration along line B-B of FIG. 2. As shown in FIG. 3, interlayer insulating films 7 are provided on a semiconductor substrate defined by the active regions 4 and the isolations 6. The bit-line 10, the bit contact 12, and the cell contact 14 are arranged in an interlayer insulating film 7. The bit line 10 is connected to the active region 4 via the bit contact 12. The cell contact leading lines 20 are connected to the cell contacts 14 via contact plugs 22. The bit-lines 10 and the cell contacts 14 are alternately arranged below the cell contact leading lines 20.

The active regions 4 is included in the semiconductor substrate. For example, a silicon single crystal substrate having a mirror-polished surface is used as the semiconductor substrate. The isolation 6 is, for example, a shallow trench isolation (STI). The isolation 6 includes an insulator embedded in a trench provided in the semiconductor substrate, and includes, for example, silicon dioxide. The interlayer insulating film 7 includes an insulator, and includes, for example, silicon dioxide. The bit-line 10 includes a conductive material, and includes, for example, tungsten. The bit contact 12 includes a conductive material, and includes, for example, polysilicon doped with impurities such as phosphorous, arsenic or boron. The cell contact 14 includes a conductive material, and includes, for example, polysilicon doped with impurities such as phosphorous, arsenic or boron. The cell contact leading line 20 includes a conductive material, and includes, for example, tungsten.

In the semiconductor devices for short circuit detection according to the first and second embodiments configured as described above, a short circuit or current leakage is detected as follows. It is possible to detect a short circuit or current leakage between the bit contact 12 and the cell contact 14 in the semiconductor devices for short circuit detection according to the first and second embodiments.

In the semiconductor devices for short circuit detection according to the first and second embodiments, a voltage is applied between either or both of the first pad PAD-1 and the second pad PAD-2 and either or both of the third pad PAD-3 and the fourth pad PAD-4. The voltage is applied using a prober. As illustrated in FIGS. 1 and 2, when a short circuit or current leakage occurs at a short circuit location S between the bit contact 12 and the cell contact 14, a hot spot H occurs in the vicinity of the short circuit location S. The hot spot H can be detected using an emission microscope (Photo Emission Microscopy) in a state where the voltage is applied as described above. At the hot spot H, the temperature or electron energy is high and light emission is occurring.

The emission microscope includes an optical microscope and an ultra-sensitive camera. The hot spot H can be detected as luminescence by the ultra-sensitive camera equipped in the emission microscope. By superimposing an optical image obtained with the optical microscope and a luminescence image obtained with the ultra-sensitivity camera, the light emission position of the hot spot H can be specified, which makes it possible to detect the short circuit location S. As shown in the first and second embodiments, by increasing the interval between the cell contact leading lines 20, it is possible to enhance the positional accuracy of the luminance image of the emission microscope.

As described above, the first and second embodiments have been described by exemplifying the semiconductor device for short circuit detection for measuring the short circuit or current leakage between the cell contact and the bit contact of DRAM. However, this is an example, and it is not intended to limit to DRAM. Memory devices other than DRAM, for example, a static random access memory (SRAM), a flash memory, an erasable programmable read only memory (EPROM), a magneto-resistive random access memory (MRAM), a phase-change memory and the like may be applied as the semiconductor device for short circuit detection. Further, devices other than memories, for example, a microprocessor and logic IC such as an application specific integrated circuit (ASIC) may be applied as the semiconductor devices for short circuit detection according to the above embodiments.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a semiconductor substrate:

a plurality of active regions in the semiconductor substrate, each of the plurality of active regions surrounded by a shallow trench isolation and each divided, at least in part, into a first active area and a second active area having a channel area therebetween;

a plurality of first wirings over the plurality of active regions, each of the plurality of first wirings coupled to the first active areas of corresponding ones of the plurality of active regions; and a plurality of second wirings over the plurality of active regions, each of the plurality of second wirings coupled to the second active areas of associated ones of the plurality of active regions;

wherein each of the plurality of active regions has a longer side in a first direction, each of the plurality of first wirings extends in a second direction different from the first direction and each of the plurality of second wirings extends in a third direction different from each of the first direction and the second direction.

2. The apparatus of claim 1, further comprising:

a first global wiring coupled to odd numbered ones of the plurality of first wirings; and a second global wiring coupled to even numbered ones of the plurality of first wirings;

wherein the first global wiring is at a near side of the plurality of active regions and the second global wiring is at a far side of the plurality of active regions.

3. The apparatus of claim 2, further comprising:

a first pad coupled to the first global wiring; and a second pad coupled to the second global wiring;

wherein the first pad and the second pad are electrically independent of each other.

4. The apparatus of claim 1, further comprising:

a third global wiring coupled to odd numbered ones of the plurality of second wirings; and a fourth global wiring coupled to even numbered ones of the plurality of second wirings;

wherein the third global wiring is at a right side of the plurality of active regions and the fourth global wiring is at a left side of the plurality of active regions.

5. The apparatus of claim 4, further comprising:

a third pad coupled to the third global wiring; and a fourth pad coupled to the fourth global wiring;

wherein the third pad and the fourth pad are electrically independent of each other.

6. The apparatus of claim 1, further comprising:

a plurality of third wirings extending in the third direction with substantially the same intervals;

wherein each of the plurality of third wirings extends partially above the channel area of a corresponding one of the plurality of active regions, and each of the intervals of the plurality of third wirings is substantially a half of each of intervals of the plurality of second wirings.

7. The apparatus of claim 1, further comprising:

a plurality of third wirings extending in the third direction with substantially the same intervals;

wherein each of the plurality of third wirings extends partially above the channel area of a corresponding one of the plurality of active regions and each of the intervals of the plurality of third wirings is substantially one third of each of intervals of the plurality of second wirings.

8. An apparatus comprising:

a semiconductor substrate;

a plurality of active regions in the semiconductor substrate, each of the plurality of active regions having a longer side in a first direction, surrounded by a shallow trench isolation and divided, at least in part, into a first active area and a second active area having a channel area therebetween;

a plurality of first wirings over the plurality of active regions, each of the plurality of first wirings extending in a second direction with first intervals, each of the plurality of first wirings coupled to the first active areas of corresponding ones of the plurality of active regions; and a plurality of second wirings over the plurality of active regions, each of the plurality of second wirings extending in a third direction with second intervals longer than the first intervals, each of the plurality of second wirings coupled to the second active areas of associated ones of the plurality of active regions.

9. The apparatus of claim 8, further comprising:

a first global wiring coupled to odd numbered ones of the plurality of first wirings; and a second global wiring coupled to even numbered ones of the plurality of first wirings;

wherein the first global wiring is at a near side of the plurality of active regions and the second global wiring is at a far side of the plurality of active regions.

10. The apparatus of claim 9, further comprising:

a first pad coupled to a first global wiring; and a second pad coupled to a second global wiring;

wherein the first pad and the second pad are electrically independent of each other.

11. The apparatus of claim 8, further comprising:

a third global wiring coupled to odd numbered ones of the plurality of second wirings; and a fourth global wiring coupled to even numbered ones of the plurality of second wirings;

wherein the third global wiring is at a right side of the plurality of active regions and the fourth global wiring is at a left side of the plurality of active regions.

12. The apparatus of claim 11, further comprising:

a third pad coupled to a third global wiring; and a fourth pad coupled to a fourth global wiring;

wherein the third pad and the fourth pad are electrically independent of each other.

13. The apparatus of claim 8, further comprising:

a plurality of third wirings extending in the third direction with substantially the same intervals;

wherein each of the plurality of third wirings extends partially above the channel area of a corresponding one of the plurality of active regions, and each of the intervals of the plurality of third wirings is substantially a half of each of intervals of the plurality of second wirings.

14. The apparatus of claim 8, further comprising:

a plurality of third wirings extending in the third direction with substantially the same intervals;

wherein each of the plurality of third wirings extends partially above the channel area of a corresponding one of the plurality of active regions and each of the intervals of the plurality of third wirings is substantially one third of each of intervals of the plurality of second wirings.

* * * * *